(12) United States Patent
Pillet

(10) Patent No.: US 12,168,832 B2
(45) Date of Patent: Dec. 17, 2024

(54) SUPPLY CIRCUIT FOR ELECTROLYTIC CELL COMPRISING A SHORT-CIRCUIT DEVICE AND A DISCONNECTOR

(71) Applicant: AMC, Saint Raphaël (FR)

(72) Inventor: Michel Pillet, Cannes (FR)

(73) Assignee: AMC, Saint Raphaël (FR)

( * ) Notice: Subject to any disclaimer, the term of this patent is extended or adjusted under 35 U.S.C. 154(b) by 469 days.

(21) Appl. No.: 17/761,333

(22) PCT Filed: Sep. 17, 2020

(86) PCT No.: PCT/EP2020/076029
§ 371 (c)(1),
(2) Date: Mar. 17, 2022

(87) PCT Pub. No.: WO2021/053102
PCT Pub. Date: Mar. 25, 2021

(65) Prior Publication Data
US 2022/0341048 A1    Oct. 27, 2022

(30) Foreign Application Priority Data
Sep. 17, 2019 (FR) ...................................... 1910233

(51) Int. Cl.
*C25B 9/65* (2021.01)
*C25B 15/02* (2021.01)
(Continued)

(52) U.S. Cl.
CPC ................ *C25B 9/65* (2021.01); *C25B 15/02* (2013.01); *C25C 1/12* (2013.01); *C25C 3/16* (2013.01);
(Continued)

(58) Field of Classification Search
CPC .... C25C 3/06; C25C 3/16; C25C 3/20; C25C 7/005
See application file for complete search history.

(56) References Cited

U.S. PATENT DOCUMENTS 4,397,728 A * 8/1983 Pfister ....................... C25C 3/16
204/247.1
4,421,614 A * 12/1983 Yamaguchi ............. C25B 15/00
205/347
(Continued)

FOREIGN PATENT DOCUMENTS

CN    104674304 A * 6/2015 ............... C25C 3/16
CN    104874972 A * 9/2015 ............... B23P 6/00
(Continued)

OTHER PUBLICATIONS

Machine translation of Ruan et al CN-104674304-A (Year: 2015).*
(Continued)

*Primary Examiner* — Harry D Wilkins, III
(74) *Attorney, Agent, or Firm* — Meunier Carlin & Curfman LLC

(57) ABSTRACT

A circuit for supplying electrical power at a rated direct current of 20-100 kA to an electrolysis cell is provided. The circuit comprises an upstream and a downstream busbar connected to each other with a short-circuiting device which, when closed by an actuating mechanism, allows the busbars to be electrically connected to each other. An anode bar is equipped with an anode connection interface and a cathode connection interface, for connection to the anode and cathode, respectively. The cathode connection interface is connected to the downstream busbar. The circuit comprises means for absorbing movement of elements of the circuit due to thermal expansion. A disconnector connected to the upstream busbar and to the anode bar is opened by an actuating mechanism and it electrically disconnects the
(Continued)

upstream busbar and the anode bar from each other after a non-zero time interval Tm when the short-circuiting device has been closed.

16 Claims, 3 Drawing Sheets

(51) Int. Cl.
    *C25C 1/12*     (2006.01)
    *C25C 3/16*     (2006.01)
    *C25C 7/00*     (2006.01)
    *C25C 7/06*     (2006.01)
    *H02B 1/20*     (2006.01)

(52) U.S. Cl.
    CPC .................. *C25C 7/00* (2013.01); *C25C 7/06* (2013.01); *H02B 1/205* (2013.01)

(56) References Cited

U.S. PATENT DOCUMENTS

| | | | | |
|---|---|---|---|---|
| 4,431,492 A * | 2/1984 | Arita | ..................... | C25C 3/16 204/247.1 |
| 4,474,610 A * | 10/1984 | Kato | ..................... | C25C 3/16 204/247.1 |
| 4,561,949 A | 12/1985 | Miles et al. | | |
| 4,589,966 A * | 5/1986 | Ford | ..................... | C25B 9/66 205/345 |
| 5,346,596 A * | 9/1994 | Borrione | ............... | H01H 33/002 205/770 |
| 10,151,038 B2 | 12/2018 | Rochet et al. | | |
| 2008/0029403 A1* | 2/2008 | Ramaswamy | ............ | C25C 3/20 205/230 |
| 2015/0027878 A1* | 1/2015 | Funakawa | ................ | C25B 11/04 204/252 |
| 2015/0279579 A1* | 10/2015 | Pillet | ..................... | H01H 33/596 200/243 |
| 2016/0186343 A1* | 6/2016 | Rochet | ..................... | C25C 3/16 204/225 |
| 2017/0350026 A1* | 12/2017 | Funakawa | ................. | C25B 1/04 |

FOREIGN PATENT DOCUMENTS

| | | | | |
|---|---|---|---|---|
| CN | 108277505 A * | 7/2018 | ............... | C25C 3/16 |
| FR | 2805098 A1 | 8/2001 | | |
| WO | 2015017922 A1 | 2/2015 | | |
| WO | WO-2017046677 A1 * | 3/2017 | ............... | C25C 3/06 |
| WO | WO-2017174869 A1 * | 10/2017 | ............... | C25C 7/00 |
| WO | WO-2018116076 A1 * | 6/2018 | ............... | C25C 3/10 |

OTHER PUBLICATIONS

Machine translation of Wu et al CN-104874972-A (Year: 2015).*
Machine translation of Kang et al CN-108277505-A (Year: 2018).*
English Translation of the International Search Report issued in PCT/EP2020/076029, mailed Oct. 21, 2020.

* cited by examiner

SUPPLY CIRCUIT FOR ELECTROLYTIC CELL COMPRISING A SHORT-CIRCUIT DEVICE AND A DISCONNECTOR

CROSS REFERENCE TO RELATED APPLICATIONS

This application is a United States National Phase Patent Application of International Patent Application Number PCT/EP2020/076029, filed on Sep. 17, 2020, which claims the benefit of priority to French Application No. 1910233, filed on Sep. 17, 2019, the contents of which are incorporated by reference herein in their entireties.

TECHNICAL FIELD OF THE INVENTION

The present invention relates to the technical field of power supply devices for appliances operating at very high current such as electrolysis tanks in series and relates in particular to a power supply circuit for an electrolysis cell comprising a short-circuiting device and a disconnector.

BACKGROUND ART

Very thin copper sheets can be obtained by an electrolysis process in an electrolytic bath comprising a cylindrical negative electrode made of titanium, called a drum, a positive electrode covered with a metal such as titanium, platinum or iridium or one of their alloys, and a direct current power source of between 20 kA and 100 kA. When a direct current flows between the negative electrode and the positive electrode in the electrolytic bath made up of suitable acids, copper is electro-deposited on the cylindrical negative cathode, which, while rotating, continuously produces sheets of copper. The electrolytic tanks are generally electrically connected in series in large rooms where they can reach several dozen in number. Such facilities use high currents in excess of 1000 amperes which can reach several tens of thousands of amperes or even a few hundred thousand amperes for some. The cells are powered by large section busbars. These electrolysis rooms are equipped with devices for short-circuiting the electrolysis cells individually so as to be able to carry out their maintenance without shutting down the electrolysis room.

The short-circuiting device is connected to the cathode of the previous cell (i.e., to the current output electrode) and to the anode of the next cell (i.e., to the current input electrode). Closing this short-circuiting device allows all the current to be diverted and the cell to be shunted. A step to bring the cell offline is also required. This step is carried out manually by disconnecting the bolted contacts that connect the power busbars to the cell anode or by removing blocks situated at the location of the connections. Disconnecting the anode eliminates any current flow in the tank.

In electrolysis rooms, these short-circuiting devices are mobile so that they can be connected to the cell to be taken offline, disconnected and then reconnected to another cell as required. These connections and disconnections are done partly by hand. In addition to being dangerous for the operators, these interventions are detrimental to production because their implementation is generally time-consuming.

In addition, they are a source of significant current variations which induce significant thermal expansion of the supply conductors such as the busbars. To absorb such expansion, the power supply circuits of the electrolysis cells are equipped with flexible conductors adapted to move during the expansion of the various power conducting elements. These flexible conductors are either copper or aluminum braids or copper or aluminum strips. Indeed, braids and strips are made up of a large number of thin conductors, either in the form of strands or in the form of sheets approximately 1 mm thick, which have a large surface area in contact with the air, while being very close or even in contact with each other. The thinness of the conductors that comprise them gives them great flexibility. Unfortunately, their large surface area in contact with the air as well as their low thickness provide a large surface area subject to chemical and thermal attack in electrolysis rooms. As a result, these flexible conductors are fragile and degrade more quickly than other rigid conductors. In addition, their degradation increases their electrical resistance, which increases the dissipation of electrical energy by the Joule effect and degrades the efficiency of the cell.

Although they have a large contact surface with the air, these flexible conductors do not provide a sufficient airflow surface area to effectively evacuate the heat dissipated by the Joule effect. Consequently, if one wants to maintain the efficiency of the cell, these conductors must be replaced more often, and the electrolysis cell must be shut down more often.

On the other hand, electrolysis cells adapted to produce copper sheets with a supply current of between 20 kA and 100 kA require specific anodes compared to those, generally made of graphite, of the electrolysis cells for producing aluminum. These specific anodes are covered with rare metals such as titanium, platinum or iridium. During the cell short-circuiting process, a reverse current peak flows through the anodes, which can reach two to three times the rated current. This phenomenon is explained in detail in the description with reference to FIG. 4. This reverse current peak degrades the coating of the anodes, necessitating frequent shutdowns of the cell necessary to repair or replace the anode, which represents high costs.

An example of a short-circuiting device is described in document FR2805098 in which a resistor is associated with the short-circuiting device. It is a complex device that biases the cell and short-circuits it after a long time in the order of several hours corresponding to the cell discharging step. In addition, it is only applicable to chlorine-soda electrolysis cells and not to copper electrolysis.

In practice, in electrolysis cell rooms, the current passing through the cell is reduced before the short-circuiting operation in order to minimize the intensity of the reverse current peak. This intensity reduction step takes time and affects all the electrolysis cells of the same line powered in series. This disrupts the operation of the cells, which then produce copper sheets of lower quality. The energy consumption of electrolysis cells represents a significant part of the cost of production. This consumption can be reduced by reducing the thermal losses through the various conductive elements constituting the circuit according to the invention.

SUMMARY OF THE INVENTION

This is why the object of the invention is to overcome these drawbacks by providing an autonomous power supply and short-circuiting circuit for an electrolysis cell that has low electrical resistance and which allows fast short-circuiting of a cell without impacting the operation of the other cells.

Another object of the invention is to provide a power supply and short-circuiting circuit for an electrolysis cell which makes it possible to cancel the reverse current, which is created when the electrolysis cell is short-circuited and which therefore prevents the degradation of the electrodes.

The object of the invention is, therefore, a rated direct current power supply circuit of between 20 kA and 100 kA for an electrolysis cell comprising an upstream busbar through which the current from the previous cell arrives, a downstream busbar connected to the upstream busbar of the next cell, the two upstream and downstream busbars being connected to each other via a short-circuiting device which, when closed under the action of an actuating mechanism, makes it possible to electrically connect the two busbars to each other in order to cut off the power supply to the cell. The circuit also comprises an anode bar equipped with an anode connection interface intended to be connected to the anode of the cell and a cathode connection interface intended to be connected to the cathode of the cell. According to the main features of the invention, the cathode connection interface is connected to the downstream busbar by means of a flexible electrical connector; the circuit comprises means for absorbing the movement of the various constituent elements of the circuit due to thermal expansion and a disconnector connected, on the one hand, to the upstream busbar and, on the other hand, to the anode bar, the disconnector is opened by an actuating mechanism and electrically disconnects the upstream busbar and the anode bar from each other after a non-zero time interval Tm when the short-circuiting device has been closed, the time interval Tm corresponding to the time of establishment of the rated current in the short-circuiting device.

BRIEF DESCRIPTION OF THE DRAWINGS

The purposes, objects and characteristics of the invention will become more apparent from the following description when taken in conjunction with the accompanying drawings in which.

DETAILED DESCRIPTION OF THE INVENTION

The electrolysis cells in a line are powered in series by a direct current in a closed loop. The electric current flows through the various electrical elements: busbars, anode bar, anode connection, anode, electrolytic bath, cathode, cathode connection, cathode bar, then busbar and so on.

Figure 1:
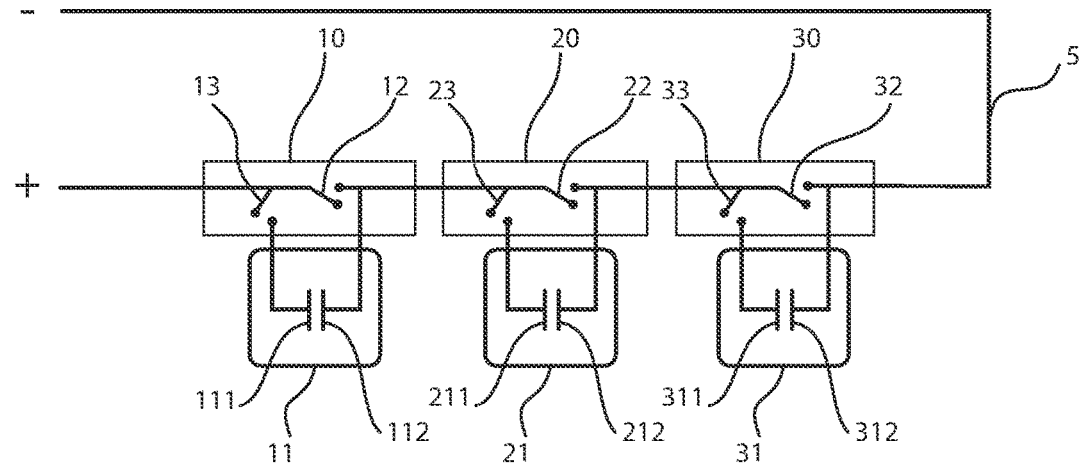
FIG. 1 shows a schematic view of the electrical diagram of a line of electrolysis cells equipped with the circuit according to the invention.

According to FIG. 1, which represents an electric circuit 5 of a part of a line composed of three electrolysis cells 11, 21 and 31, each cell comprises an anode 111, 211 and 311 and a cathode 112, 212 and 312. Conventionally, the current flows from the anode through the first electrolysis cell, flows through the electrolytic bath, then flows through the cathode and goes to the anode of the next cell (or downstream cell) and so on. Thus, in our example, the current flows in the anode 111, crosses the electrolytic bath of the cell 11, flows into the cathode 112 then, by an electrical connection in a conductor, flows into the anode 211 of the adjacent downstream cell 20.

The circuit according to the invention is a power supply circuit 10, 20, 30 connected to the electrodes of a cell 11, 21, 31 and which makes it possible to supply power to the cell and to switch it off in case of maintenance.

Each circuit 10, 20 and 30 comprises a short-circuiting device 12, 22 and 32 enabling the cell 11, 21 and 31 to be switched off respectively, a disconnector 13, 23 and 33 enabling the anode 111, 211 and 311 respectively to be isolated from the cell, a set of connections and conductors and means for actuating the short-circuiting device and the disconnector.

The disconnector and the short-circuiting device are devices for disconnecting a high-current electrical power supply line of the type described in document WO2014/068201.

When it is necessary to switch off the electrolysis cell 21, the short-circuiting device 22 is closed, which makes it possible to divert all the current coming from the cathode 112 of the previous cell 11 located upstream towards the anode 311 of the next cell 31 located downstream. Similarly, the disconnector 23 is open so as to isolate the anode 211 from the cell 21 and to suppress any current flow in order to be able to work on the cell.

Figure 2:
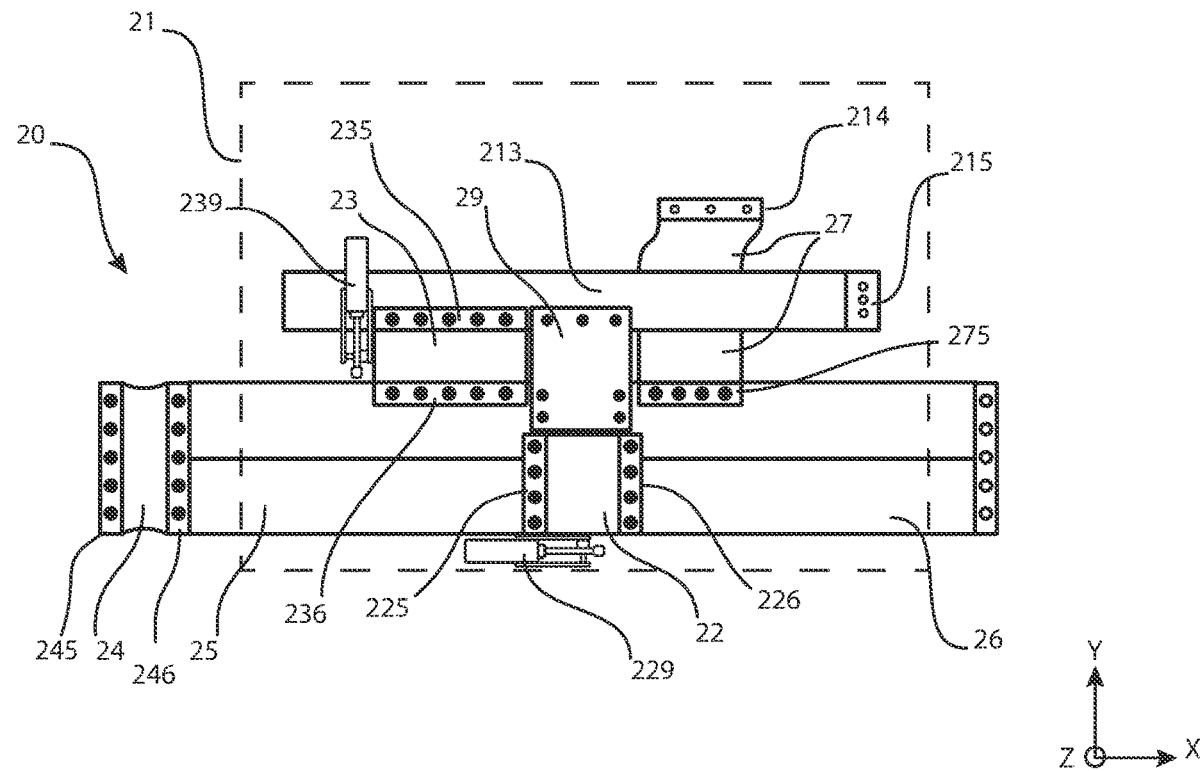
FIG. 2 shows a front schematic view of the circuit according to the invention.

The circuit 20 according to the invention is shown schematically from the front in FIG. 2, where it is placed in front of the electrolysis cell 21 shown in dotted lines in the figure. The circuit 20 further consists of an upstream busbar 25 through which the current arrives from the previous cell 11, and more specifically from the upstream power supply circuit 10 (similar to circuit 20) of the previous cell 11, a downstream busbar 26 through which the current goes into the next cell 31 and more precisely into the downstream power supply circuit 30 (similar to circuit 20) of the next cell 31 and of the short-circuiting device 22. Terminal pads of the short-circuiting device make it possible to electrically connect the busbars to the short-circuiting device using bolted connections 225 and 226 in order to connect the two busbars 25 and 26 to each other via the short-circuiting device 22. Between the busbars 25 and 26 and the terminal pads of the short-circuiting device is a layer of ECOCONTACT (registered trademark) foam consisting of a skeleton of metal foam chosen from the group consisting of iron, cobalt, nickel and their alloys, covered with at least one coating of tin, indium or one of their alloys. The surface of the foam layer has a multitude of contact tips. Thanks to these tips, the foam layer has numerous contacts with the busbar, on the one hand, and with the terminal pad, on the other hand, which makes it possible to obtain high conductivity and, therefore, low resistance. All the bolted connections of the circuit according to the invention are equipped with a layer of ECOCONTACT metallic foam placed between the surfaces in contact before they are tightened.

An anode bar 213 is connected to the upstream busbar by means of the disconnector 23. The disconnector is electrically connected to the two bars by two bolted connections 235 and 236. The anode bar 213 includes an anode connection interface 215 intended to connect the anode 211 of the cell 21 via a connection conductor not shown in the figure. A cathode connection interface 214, intended to be connected to the cathode 212 of the cell 21, is electrically connected to a flexible electrical connector 27. The connector 27 is electrically connected to the busbar 26 by a bolted connection 275. The connector 27 comprises means for absorbing the movement of the various constituent elements of the circuit and of the cell due to thermal expansion.

The devices according to the invention are connected to each other via a flexible electrical connector of the same type as connector 27. Thus, the circuit 20 is electrically connected to the circuit 10 located upstream via a flexible electrical link connector 24 connected by two bolted connections 245 and 246. It is also connected to the circuit 30 located upstream by the same type of link connector. The electrical link connectors 24 include means for absorbing the movement of the busbars due to thermal expansion.

The short-circuiting device 22 and the disconnector 23 have the same main characteristics. They are composed of a plurality of disconnection modules described in document WO2014/068201. Each disconnection module is capable of passing a current of approximately 3000 A and comprises at least a first fixed contact conductive element for establishing the electrical connection with a current input and a second fixed contact conductive element for establishing the electrical connection with a current output, the fixed contact elements being electrically connected by two terminal pads, and at least one mobile contact conductive element adapted to come into contact simultaneously on the first and second fixed contact elements under the action of an actuating mechanism. In the nominal position, the short-circuiting device is open while the disconnector is closed. In the case of the disconnector 23, the actuating mechanism is actuated to remove the contact between the fixed contact elements and the mobile contact element and thus open the disconnector while, in the case of the short-circuiting device 22, the mechanism is actuated in the other direction to bring the movable contact element into contact with the fixed contact elements and thus close the short-circuiting device. The closing of the short-circuiting device 22 makes it possible to electrically connect the two busbars 25 and 26 to each other to cut off the electrical power supply of the cell 21.

The disconnector and the short-circuiting device of the circuit according to the invention comprise a certain number of disconnection modules in parallel, their number being adapted to the current to be disconnected. For the disconnector and the short-circuiting device, the disconnection modules are placed in a sealed enclosure, preferably filled with an inert gas, and the two terminal pads are located outside the enclosure and are each electrically connected respectively to the first fixed contact conductive element and to the second fixed contact conductive element of all the modules.

Preferably, for each disconnection module, a silver pad is fixed on the surface of each of the mobile contact elements coming into contact with each of the first and second fixed contact elements.

According to a preferred embodiment, at least one of the fixed contact elements comprises a lower layer made of aluminum, an upper layer made of copper having a silver coating and an intermediate layer of foam made up of a metal foam skeleton selected from the group consisting of iron, cobalt, nickel and their alloys coated with at least one coating of tin, indium or one of their alloys.

The short-circuiting device 22 has an opening capacity under load greater than the opening capacity of the disconnector 23 because the short-circuiting device is actuated under load unlike the disconnector which is actuated at low load or at zero load.

The circuit according to the invention comprises a support element 29 positioned at the center of the circuit and to which the upstream busbar 25 and the downstream busbar 26 as well as the anode bar 213 are secured via electrical insulation means. Due to its central position, the support element stiffens the entire circuit and in particular the parts of the circuit located near it. Indeed, the further one moves away from this element, the greater the movement of the conductors due to thermal expansion.

The disconnector 23 and the short-circuiting device 22 are placed so as to be as close as possible to the support element 29 so as to be stressed as little as possible by the movements due to the expansion of the conductors.

The disconnector and the short-circuiting device each have their own actuating mechanism. Preferably, the actuating mechanism of the short-circuiting device 22, or first actuating mechanism, is a pneumatic cylinder 229 and the actuating mechanism of the disconnector 23, or second actuating mechanism, is a pneumatic cylinder 239.

The disconnector 23 is placed perpendicular to the short-circuiting device so that the disconnection modules of the short-circuiting device are perpendicular to the disconnection module of the disconnector 23. This helps reduce space requirements. The two cylinders are thus placed perpendicular to each other.

The characteristics of the flexible electrical connectors 27 and 24 are detailed with reference to FIG. 3 which shows the circuit according to the invention seen from the side and in particular the flexible electrical connector 27 seen from the side.

Figure 3:
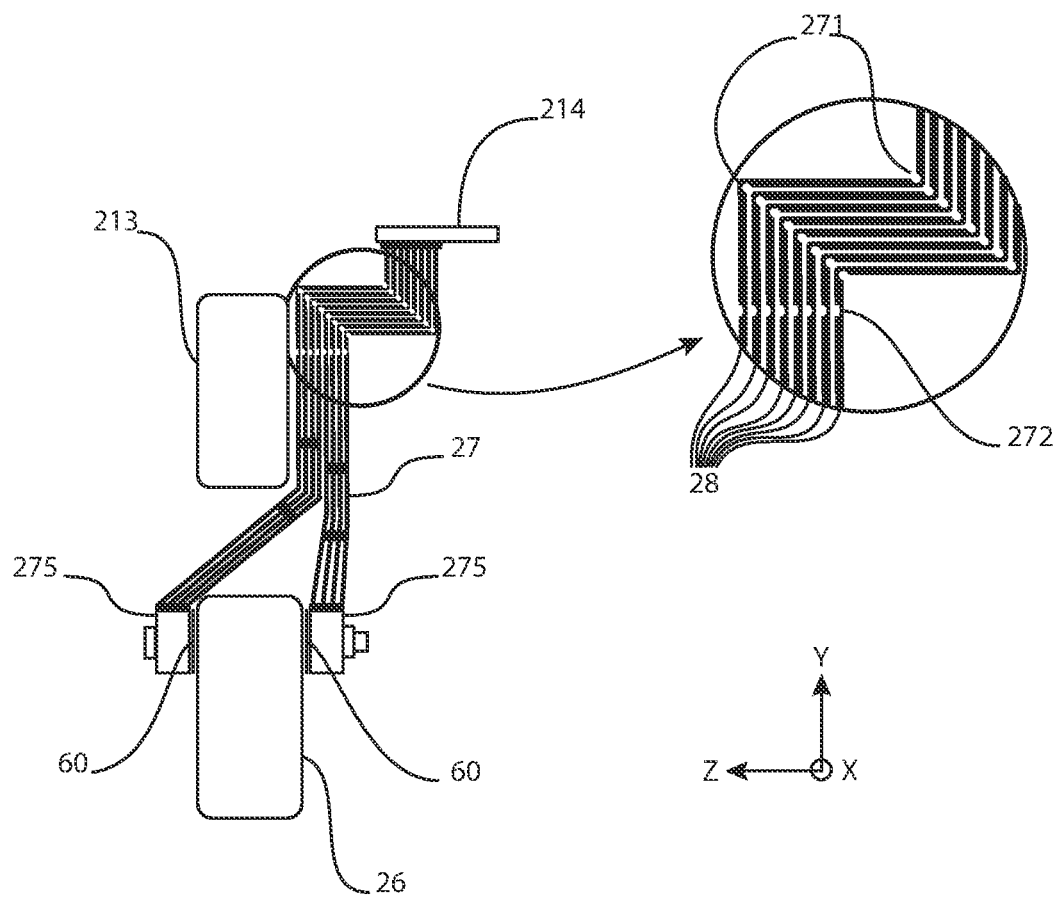
FIG. 3 shows a schematic and partial side view of the circuit according to the invention.

According to FIG. 3, it can be seen that the shape of the flexible electrical connector 27 is adapted to carry current between the downstream busbar 26 and the cathodic connection interface 214 so that it allows for changes of direction and the bypass of the anode bar 213 while allowing for movements of the various electrical bars and conductors and of the electrolysis cell.

Indeed, the current flowing in the power supply conductors and in the cell can cause movements in the electrolytic bath, thermal expansion and deformations of the metal parts of the circuit. In order to be able to absorb these deformations, the flexible electrical connector 27 is composed of a plurality of blades 28, preferably made of aluminum as can be seen in FIG. 3. In our example, the connector has eight blades, four of which are connected to one side of the busbar 26 and four are connected to the opposite side. Thanks to the bolted connection 275, the connector is in tight contact with the busbar. A layer of metallic foam 60, as previously defined, is positioned between the surfaces in contact in order to reduce the contact resistance and to improve the electrical conductivity of the connection.

The blades are bent according to at least a first angle in one direction, then according to a second angle in the opposite direction to the first so that they comprise two bends (like a Z) and so that they are as flexible as possible and can be deformed in the two angles of the Z under the effect of the temperature and the expansion and displacement of the conductors. In addition, they have a very large surface exposed to air, a surface which is composed of the two faces of each blade multiplied by the total number of blades, and the thickness of the air layer between the blades is sufficient to allow natural convection. The thickness of the blades is between 1 cm and 3 cm and the thickness between the blades is between 5 mm and 2 cm.

Although of different shape, the connector 24 also comprises a plurality of blades 28, each comprising at least one bend at an angle adapted to the geometry of the connection to be made. For each connector 24 or 27, the length of the blades, the number of bends and the angle of the bends are adapted to the geometry of the electrolysis cells to be equipped. Compared to flexible conductors of the copper braid or aluminum strip type, the blades of the connector 24 and 27 of the circuit according to the invention have the advantage of offering a certain rigidity which facilitates assembly on the cell. Indeed, a force of 100 kg is necessary to bend them. In addition, the thickness of the blades compared to the strands of a braid or compared to the sheets of the strips is greater, which allows better resistance over time. The flexible electrical connectors 24 and 27 of the circuit according to the invention are designed to provide sufficient flexibility to allow the movement of the busbars and other conductive elements due mainly to thermal expansion or contraction created by high currents and by chemical reactions of the cell.

According to an advantageous characteristic of the flexible connectors according to the invention, the thickness of the blades 28 is constant except at least one different location where it has a reduction in thickness. The blades have a reduction in thickness 271 at the location of the bend on the side of the salient angle. At the location of the reduction in thickness, the cross-sectional area of the blade is reduced to more than half over a length of blade which does not exceed twice the thickness of the blade.

This reduction at the bend angles of the blades has several advantages. The reduction is done before bending, which reduces the force required during the bending operation and facilitates bending. Moreover, compared to bending of a blade of constant thickness, no bulge of material appears at the location of the salient angle. A bulge of material tends to create stresses in the blade and reduces the overall elasticity of the blade. The connector according to the invention having blades with at least one bend or two bends in opposite directions and at least one reduction in thickness at the location of each salient angle of the bend, has greater elasticity in the directions along the Y- and Z-axes than a connector with one or two bends without reduction in thickness.

Preferably, the blades 28 of the connector according to the invention also have a reduction in thickness 272 on the flat and straight part of the blades so as to increase the elasticity of the blades in the directions perpendicular to the flat surfaces of the blades, i.e., in the directions of the Z-axis in FIG. 3 but also along the directions of the Y-axis.

Figure 4:
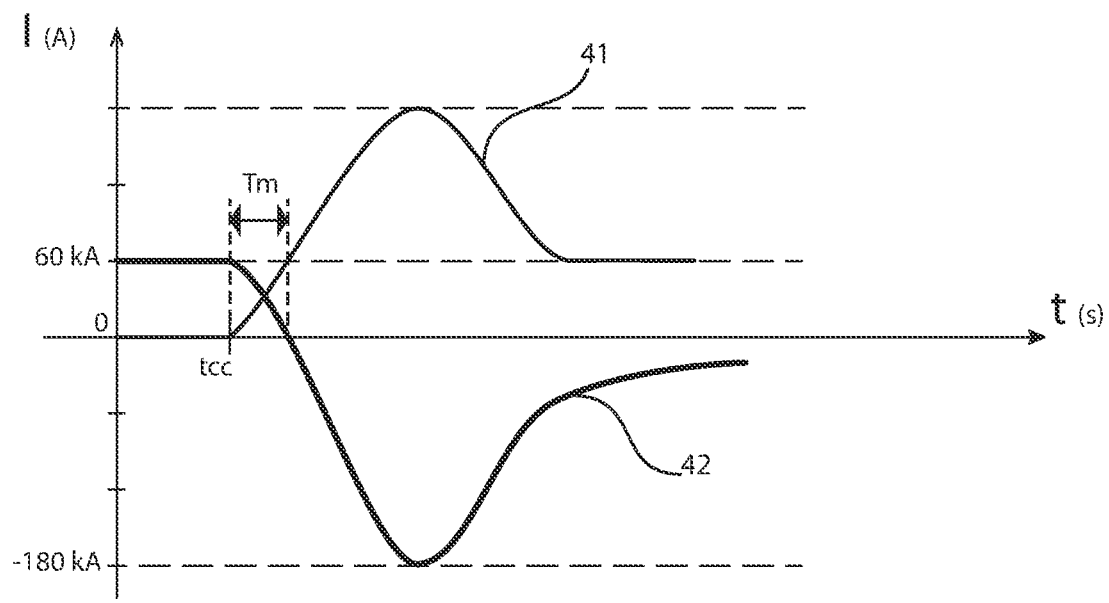
FIG. 4 shows a curve showing the evolution of the current flowing in the anode when the cell being switched off is not equipped with the circuit according to the invention.

The graph of FIG. 4 shows the evolution of the current as a function of time in the short-circuiting device by a curve 41 in thin lines and in the anode by a curve 42 in thick lines in the case of an electrolysis cell powered and short-circuited according to a power supply circuit of the state of the art. A rated current of 60 kA flows through the cell anode as long as the short-circuiting device is open. When the short-circuiting device closes, which is performed in our example at a time tcc, the current decreases in the anode while the current in the short-circuiting device increases gradually. The progressive rise and fall of the current is normal and is due to the high value of the current. The current in the anode not only decreases to zero; it reverses to reach a peak value of 180 kA. This reverse current then decreases gradually to reach a very low value in a few hours. During the reverse current peak, which lasts only a few seconds, the coating of the anodes is greatly degraded.

The circuit according to the invention makes it possible to avoid the reverse current peak and, therefore, to avoid the degradation of the anode of the electrolysis cell. Indeed, the operation of the disconnector of the circuit according to the invention is linked to the operation of the short-circuiting device, thanks to a synchronization of the closing and opening times of the short-circuiting device and the disconnector. Indeed, the disconnector is set to open when the current in the anode is close to zero, which prevents the anode from being crossed by a high reverse current. After the short-circuiting performed at time tcc, the rated continuous current in the short-circuiting device is established after a non-zero time interval Tm comprised between 50 ms (milliseconds) and 300 ms. The time required for the rated current to establish corresponds to the rise time of the current from zero to the rated current in the short-circuiting device after the establishment of electrical contact in the short-circuiting device.

According to the invention, the disconnector is set to operate and open the anode power supply circuit before the end of the period Tm of establishment of the rated current in the short-circuiting device or at the end of the period of establishment Tm. During this period of time Tm, the electrolysis cell is crossed by an electrolysis current decreasing to zero. Thus, no reverse current crosses the electrolysis cell and the anode. The adjustable time Tm is linked to the physical characteristics of the electrolysis cell such as its size. According to the invention, the disconnector opens under the action of the actuating mechanism 239 and electrically disconnects the upstream busbar and the anode bar from each other after the non-zero time interval Tm when the short-circuiting device has been closed.

Figure 5:
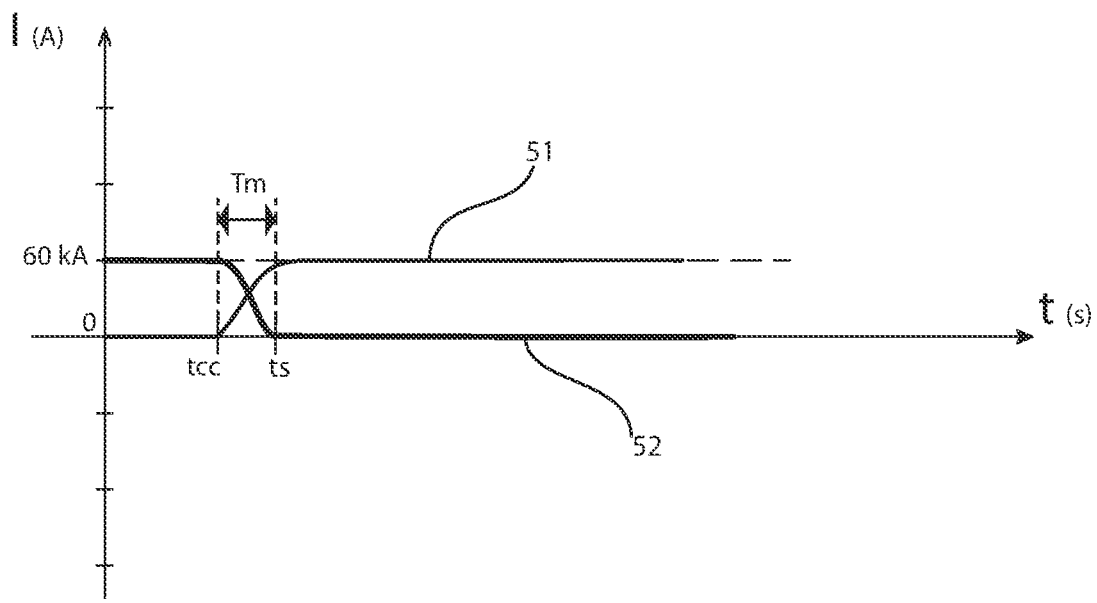
FIG. 5 shows a curve showing the evolution of the current flowing in the anode when the cell being switched off is equipped with the circuit according to the invention.

The result of this synchronization of the closing and opening times of the short-circuiting device and the disconnector is illustrated on the curve of the graph in FIG. 5 which represents the current in the short-circuiting device and in the anode as a function of time when the cell is equipped with the circuit according to the invention.

At time t equal to tcc corresponding to the closing of the short-circuiting device, the current in the short-circuiting device increases progressively according to curve 51 while the current of 60 kA in the anode decreases. When a period of time Tm has elapsed, which corresponds to the time required for the current to reach its rated value of 60 kA in the short-circuiting device, the disconnector opens. The opening of the disconnector at this moment allows the current in the anode not to reverse and to remain zero as can be seen on the curve 52 in FIG. 5.

Thanks to the circuit according to the invention, the power supply circuit of the anodes opens before the current reversal in the anodes which are thus protected against any reverse current which degrades their coating.

The time Tm can be determined either following a series of tests and measurements or from a real-time calculation. The circuit according to the invention has the advantage of being able to be actuated remotely, which avoids human intervention near the cells.

Each power supply circuit according to the invention comprises a command and control box comprising an interface, means for controlling the actuation of the pneumatic cylinders 229 and 239, alarms, prohibitions and voltage drop indicators. An alarm can be triggered if the maximum temperature is exceeded, if there is a lack of air, etc.

The interface of the command and control box provides the position of the short-circuiting device and the position of the disconnector. The box prevents the disconnector from opening if the short-circuiting device is open and prevents short-circuiting device from opening if the disconnector is open.

The command and control box is connected to the actuating mechanisms of the short-circuiting device and the disconnector and controls their opening and closing. In particular, the box automatically controls the time interval between the closing of the short-circuiting device and the opening of the disconnector. Actuation of the cylinders, almost simultaneous, is controlled thanks to a coupling of the two cylinders by bevel gear, and is facilitated by their positioning perpendicular to each other.

Preferably, the busbars 25 and 26, the anode bar 213 and the flexible connectors 24 and 27 are surface-treated beforehand and covered with a black coating which reduces their temperature.

The circuit according to the invention is in the form of a module which has the advantage of being able to be prefabricated in the factory and connected directly to the electrodes of the cell in the electrolysis room. Thus, its installation time is reduced to a few hours compared to traditional power supply systems which are assembled piece by piece in the electrolysis room and which require several weeks. The use of ECOCONTACT metal foam layers also reduces assembly time. Indeed, using foam avoids assembly by welding and allows the disconnector or the short-circuiting device to be interchanged by simple mechanical operation of unbolting-bolting.

Unlike conventional short-circuiting systems which are mobile in the electrolysis room and connected to a cell when the latter is taken off line, the circuit according to the invention is permanent and dedicated to a single cell. The circuit according to the invention reduces the overall resistance of the overall power supply circuit for better energy efficiency while featuring a reduced footprint in front of the cell.

The circuit according to the invention makes it possible to combine the functions of short-circuiting the cell and of disconnection of the anode in the same circuit that is easily interchangeable and has a low electrical resistance.

The invention claimed is:

1. A circuit for supplying electrical power at a rated direct current of between 20 kA and 100 kA to an electrolysis cell comprising an upstream busbar by which the current arrives from the previous cell, a downstream busbar connected to the upstream busbar of the next cell, said two upstream and downstream busbars being connected to each other by means of a short-circuiting device which, when closed under the action of an actuating mechanism, allows the two busbars to be electrically connected to each other in order to cut off the electrical power supply to the cell, an anode bar equipped with an anode connection interface for connection to the anode of the cell, and a cathode connection interface for connection to the cathode of the cell, wherein the cathode connection interface is connected to the downstream busbar by means of a flexible electrical connector and the circuit comprises means for absorbing the movement of the various constituent elements of the circuit due to thermal expansion, a disconnector connected, on the one hand, to the upstream busbar and, on the other hand, to the anode bar, said disconnector is opened by an actuating mechanism and electrically disconnects said upstream busbar and said anode bar from each other after a non-zero time interval Tm when the short-circuiting device has been closed, the time interval Tm corresponding to the time of establishment of the rated current in the short-circuiting device.

2. The circuit according to claim 1, wherein said actuating mechanism of the short-circuiting device is a first pneumatic cylinder and said actuating mechanism of the disconnector is a second pneumatic cylinder.

3. The circuit according to claim 2, wherein the disconnector is perpendicular to the short-circuiting device and wherein the first cylinder is perpendicular to the second cylinder.

4. The circuit according to claim 1, wherein the circuit is, electrically connected to a circuit located upstream via a flexible electrical link connector linked by two bolted connections.

5. The circuit according to claim 1, wherein the means for absorbing the movement of the constituent elements of the circuit due to thermal expansion comprise the flexible electrical connectors each composed of a plurality of blades with a thickness of between 1 cm and 3 cm, said blades comprising at least one bend forming a first angle and having a reduction in thickness at the location of the bend on the side of the salient angle.

6. The circuit according to claim 5, wherein the blades of the flexible electrical connectors have a reduction in thickness on a flat and straight part so as to increase the elasticity of the blades in the directions perpendicular to the flat and straight part of the blade.

7. The circuit according to claim 1, wherein the short-circuiting device is connected to the busbars by bolted connections, wherein the disconnector is electrically connected to the upstream busbar and to the anode bar by two bolted connections and wherein the connector is connected to the downstream busbar by a bolted connection.

8. The electrical circuit according to claim 7, wherein said bolted connections are provided with a layer of metallic foam placed between the contacting surfaces before they are tightened.

9. The electrical circuit according to claim 8, wherein said foam layer is made up of a skeleton of metal foam selected from the group consisting of iron, cobalt, nickel and their alloys coated with at least a coating of tin, indium or one of their alloys.

10. The circuit according to claim 1, further comprising a support element positioned at the center of the circuit and to which the upstream busbar and the downstream busbar as well as the anode bar are secured via electrical insulation means.

11. The circuit according to claim 10, in which the disconnector and the short-circuiting device are placed so as to be as close as possible to the support element.

12. The circuit according to claim 1, further comprising a command and control box comprising an interface, means for controlling the actuation of said actuation mechanisms, alarms, prohibitions and voltage drop indicators.

13. The circuit according to claim 1, wherein the disconnector and the short-circuiting device comprise a plurality of disconnection modules, each module comprising at least one first conductive fixed contact element for establishing the electric connection with a current input and a second fixed contact conductive element for establishing the electrical connection with a current output, the fixed contact elements being electrically connected by two terminal pads, and at least one mobile contact conductive element adapted to come into contact simultaneously on the first and second fixed contact elements under the action of the actuating mechanism, the disconnection modules being placed in a sealed enclosure.

14. The circuit according to claim 13, wherein the sealed enclosure is filled with an inert gas.

15. The circuit according to claim 1, wherein the busbars, the anode bar and the flexible electrical connectors are covered with a black coating.

16. The circuit according to claim 1, wherein the short-circuiting device has a load opening capacity greater than the load opening capacity of the disconnector.

* * * * *